(12) United States Patent  
Bell et al.

(10) Patent No.: US 7,319,728 B2  
(45) Date of Patent: Jan. 15, 2008

(54) DELAY LOCKED LOOP WITH FREQUENCY CONTROL

(75) Inventors: Debra M. Bell, Boise, ID (US); Paul A. Silvestri, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 640 days.

(21) Appl. No.: 10/147,146

(22) Filed: May 16, 2002

(65) Prior Publication Data

US 2003/0215040 A1 Nov. 20, 2003

(51) Int. Cl.
- H04L 7/04 (2006.01)
- H04L 7/00 (2006.01)
- H03L 7/06 (2006.01)

(52) U.S. Cl. .................. 375/354; 375/362; 375/371; 375/373; 375/376; 327/147; 327/149; 327/154; 327/156; 327/155

(58) Field of Classification Search ........... 375/354, 375/373–376; 327/113, 116, 141, 153, 393, 327/392, 147, 149, 154, 155, 158, 189

See application file for complete search history.

(56) References Cited

U.S. PATENT DOCUMENTS

| | | | |
|---|---|---|---|
| 3,955,158 A * | 5/1976 | Upadhyayula et al. | 333/141 |
| 3,993,957 A * | 11/1976 | Davenport | 377/47 |
| 5,691,660 A * | 11/1997 | Busch et al. | 327/147 |
| 5,717,353 A | 2/1998 | Fujimoto | |
| 5,930,182 A | 7/1999 | Lee | 365/194 |
| 5,946,244 A | 8/1999 | Manning | |
| 6,002,281 A | 12/1999 | Jones et al. | |
| 6,081,462 A | 6/2000 | Lee | 365/194 |
| 6,085,345 A | 7/2000 | Taylor | |
| 6,088,255 A | 7/2000 | Matsuzaki et al. | 365/76 |
| 6,108,793 A | 8/2000 | Fujii et al. | |
| 6,172,537 B1 * | 1/2001 | Kanou et al. | 327/99 |
| 6,181,174 B1 * | 1/2001 | Fujieda et al. | 327/158 |
| 6,184,753 B1 * | 2/2001 | Ishimi et al. | 331/34 |
| 6,219,384 B1 | 4/2001 | Kliza et al. | 375/258 |
| 6,275,079 B1 | 8/2001 | Park | |
| 6,292,040 B1 * | 9/2001 | Iwamoto et al. | 327/158 |
| 6,313,676 B1 | 11/2001 | Abe et al. | 327/158 |
| 6,316,976 B1 | 11/2001 | Miller, Jr. et al. | 327/156 |
| 6,374,360 B1 | 4/2002 | Keeth et al. | 713/400 |
| 6,378,079 B1 | 4/2002 | Mullarkey | |

(Continued)

OTHER PUBLICATIONS

Tamura et al, "SA 20.7: Partial Response Detection Technique for Driver Power REduction in High-Speed Memory-to-Processor Communications", 1997 IEEE International Solid-State Circuits Conference, pp. 342-343,348.*

(Continued)

Primary Examiner—David C. Payne  
Assistant Examiner—Linda Wong  
(74) Attorney, Agent, or Firm—Schwegman, Lundberg & Woessner, P.A.

(57) ABSTRACT

A delay locked loop includes a delay line for delaying an input signal generated from an external signal. A delay controller controls the delay line to keep the external and internal signals synchronized. The delay locked loop also includes cycle control circuitry for controlling the cycle time of the signal entering the delay and the cycle time of the signal exiting the delay line.

39 Claims, 14 Drawing Sheets

U.S. PATENT DOCUMENTS

| | | |
|---|---|---|
| 6,381,194 B2 | 4/2002 | Li .................... 365/233 |
| 6,385,129 B1 | 5/2002 | Silvestri .............. 365/233 |
| 6,388,480 B1 | 5/2002 | Stubbs ................ 327/156 |
| 6,414,903 B1 | 7/2002 | Keeth et al. |
| 6,421,789 B1 | 7/2002 | Ooishi ................... 714/7 |
| 6,421,801 B1 | 7/2002 | Maddux et al. |
| 6,438,060 B1 | 8/2002 | Li .................... 365/227 |
| 6,446,180 B2 | 9/2002 | Li et al. .............. 711/167 |
| 6,456,130 B1 | 9/2002 | Schnell |
| 6,476,653 B1 | 11/2002 | Matsuzaki ............. 327/158 |
| 6,492,852 B2 * | 12/2002 | Fiscus ................ 327/158 |
| 6,600,912 B1 * | 7/2003 | Stepp et al. ........... 455/313 |
| 6,605,969 B2 | 8/2003 | Mikhalev et al. ....... 327/158 |
| 6,621,317 B2 | 9/2003 | Saeki |
| 6,771,103 B2 | 8/2004 | Watanabe et al. |
| 6,876,594 B2 | 4/2005 | Griesmer et al. |
| 6,937,076 B2 | 8/2005 | Gomm |
| 7,212,057 B2 | 5/2007 | Gomm et al. |
| 2002/0017939 A1 | 2/2002 | Okuda et al. |
| 2002/0130691 A1 | 9/2002 | Silvestri .............. 327/158 |
| 2003/0011414 A1 | 1/2003 | Bell .................... 327/233 |
| 2003/0012320 A1 | 1/2003 | Bell .................... 375/376 |
| 2003/0179639 A1 | 9/2003 | Bell et al. .......... 365/230.08 |
| 2003/0214334 A1 | 11/2003 | Gomm et al. ........... 327/158 |
| 2003/0214338 A1 | 11/2003 | Silvestri .............. 327/276 |
| 2003/0215040 A1 | 11/2003 | Bell et al. |
| 2005/0242850 A1 | 11/2005 | Kawasaki |
| 2006/0250859 A1 | 11/2006 | Bell et al. |
| 2007/0075763 A1 | 4/2007 | Gomm et al. |

OTHER PUBLICATIONS

Jang, Seong-Jin, et al., "A Compact Ring Delay Line for High Speed Synchronous DRAM", *IEEE 1998 Symposium on VLSI Circuits Digest of Technical Papers*, (Jun. 11-13, 1998), pp. 60-61.

Kim, Jae J., et al., "A low-jitter mixed-mode DLL for high-speed DRAM applications", *IEEE Journal of Solid State Circuits*, 35(10), (Oct. 2000), pp. 1430-1436.

U.S. Appl. No. 10/147,657 Non-Final Office Action mailed May 8, 2003, 10 pgs.

U.S. Appl. No. 10/147,657 Notice of Allowance mailed Nov. 4, 2003, 7 pgs.

U.S. Appl. No. 10/147,657 Notice of Allowance mailed Mar. 9, 2004, 7 pgs.

U.S. Appl. No. 10/147,657 Notice of allowance mailed May 18, 2004, 7 pgs.

U.S. Appl. No. 10/147,657 Response filed Aug. 8, 2003 to Office Action mailed May 3, 2003, 14 pgs.

U.S. Appl. No. 10/771,611 Non-final office action mailed Oct. 19, 2005, 9 pgs.

U.S. Appl. No. 10/771,611 Non-final office action mailed Mar. 23, 2005, 11 pgs.

U.S. Appl. No. 10/771,611 Non-final office action mailed Apr. 5, 2006, 7 pgs.

U.S. Appl. No. 10/771,611 Notice of allowance mailed Sep. 7, 2006, 8 pgs.

U.S. Appl. No. 10/771,611 Response filed Jul. 25, 2005 to non-final office action mailed Mar. 23, 2005, 16 pgs.

U.S. Appl. No. 10/771,611 Response filed Jul. 5, 2006 to non final office action mailed Apr. 5, 2006, 14 pgs.

U.S. Appl. No. 11/606,757 Notice of Allowance mailed Jul. 12, 2007, 8 pgs.

U.S. Appl. No. 11/606,757 Response filed Jun. 20, 2007 to Office Action received Apr. 23, 2007, 11 pgs.

* cited by examiner

DELAY LOCKED LOOP WITH FREQUENCY CONTROL

FIELD

The present invention relates generally to integrated circuits, and in particular to delay locked loops.

BACKGROUND

Delay locked loops (DLL) reside in many integrated circuits for delaying an external signal to obtain an internal signal. The internal signal usually serves as a reference signal for the integrated circuits instead of the external signal because the internal signal matches internal operating conditions of the integrated circuits, such as process, voltage, and temperature, better than the external signal does.

A typical DLL has number of delay elements, forming a delay line. The external signal propagates through a certain number of activated delay elements in the delay line to become the internal signal. The activated delay elements toggle (switch) in every cycle of the external signal. Each delay element consumes power when it toggles. The power consumption is proportional to the number of toggles. In some cases, improving the power consumed by the DLL is necessary.

SUMMARY OF THE INVENTION

Various embodiments of the invention provide circuits and methods to operate a DLL more efficiently.

In one aspect, the DLL includes a forward path for receiving an external signal to generate an internal signal. The forward path includes a delay line for applying a delay to an input signal derived from the external signal to output an output signal. An input cycle controller controls a time interval between edges of the input signal. An output cycle controller modifies a time interval between edges of the output signal. The DLL also includes a feedback path and a delay controller. The feedback path provides a feedback signal derived from the output signal. The delay controller adjusts the delay based on the feedback and input signals to synchronize the external and internal signals.

In another aspect, a method of processing signals includes modifying a cycle time of an external signal to produce an input signal. The method also applies a delay to the input signal to produce an output signal. An internal signal is generated based on the output signal. The method further adjusts the delay to synchronize the external and internal signals.

DESCRIPTION OF EMBODIMENTS

The following description and the drawings illustrate specific embodiments of the invention sufficiently to enable those skilled in the art to practice it. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
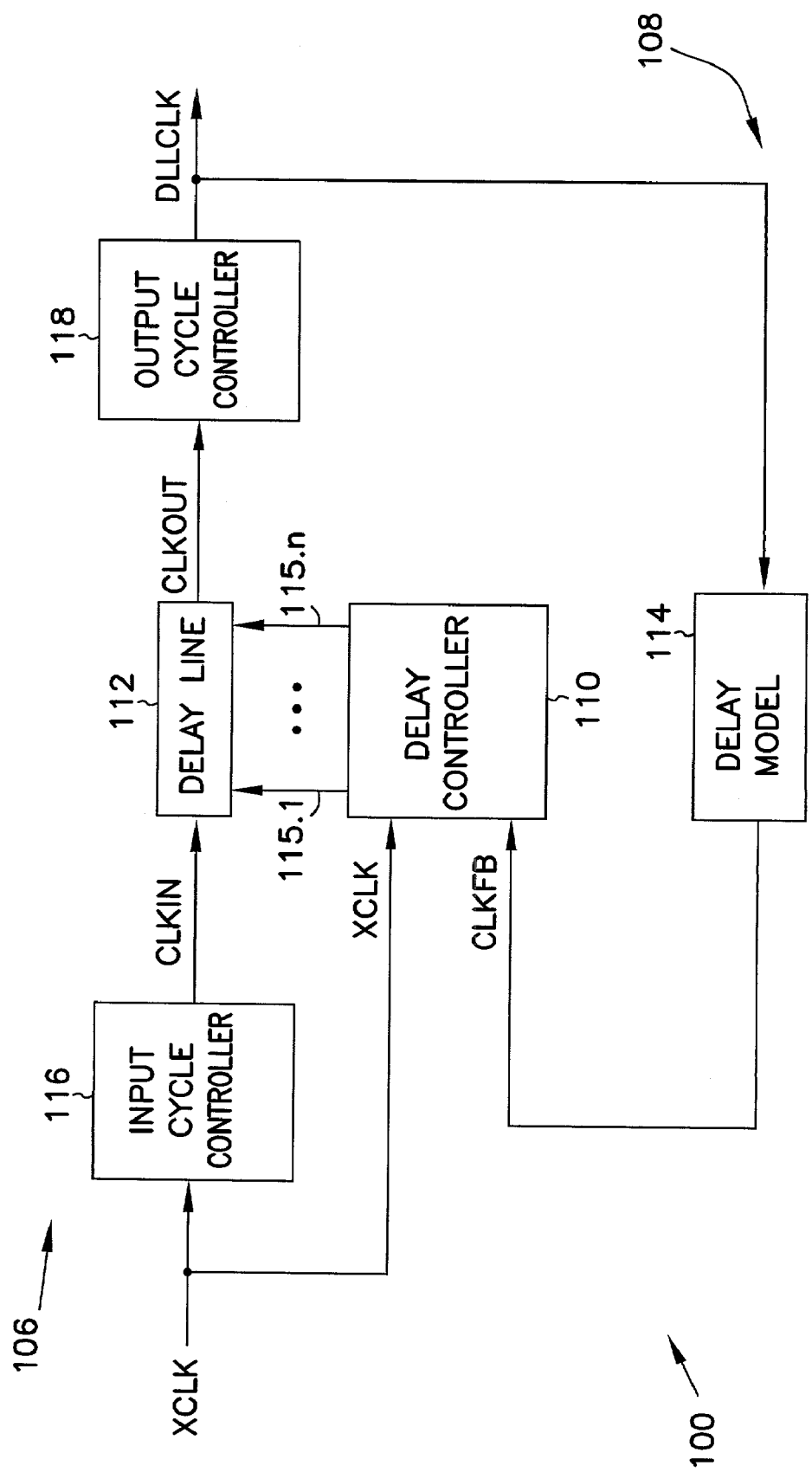
FIG. 1 shows a delay locked loop circuit according to an embodiment of the invention.

FIG. 1 shows a DLL according to an embodiment of the invention. DLL 100 includes a forward path 106 for receiving an external signal XCLK to generate an internal signal DLLCLK. A feedback path 108 provides a feedback signal CLKFB based on a signal from forward path 106. A delay controller 110 compares the XCLK and CLKFB signals to keep the XCLK and DLLCLK signals synchronized.

Forward path 106 has a delay line 112 for applying a delay to an input signal CLKIN to produce an output signal CLKOUT. An input cycle controller 116 controls a cycle time of the CLKIN signal, entering delay line 112. An output cycle controller 118 modifies a cycle time of the CLKOUT signal, exiting delay line 112. Controlling the cycle time of the CLKIN signal controls the power consumption of delay line 112.

Input cycle controller 116 controls the cycle time of the CLKIN signal by increasing the cycle time of the XCLK signal. This reduces the number of edges of the CLKIN signal propagating through delay line 112. When the number of edges is reduced, the number of toggles of delay elements in delay line 112 is decreased. When the number of toggles decreases, the power consumption of delay line 112 decreases.

In some embodiments, output cycle controller 118 decreases the cycle time of the CLKOUT signal to restore the cycle time of the XCLK signal so that the DLLCLK and XCLK signals have an equal cycle time.

Feedback path 108 has a delay model 114 for delaying the DLLCLK signal to provide a feedback signal CLKFB. This feedback signal is a version of the DLLCLK signal.

Delay controller 110 compares the XCLK and CLKFB signals to determine a delay between the XCLK and DLLCLK signals. Based on the comparison, delay controller 110 selects tap lines 115.1-115.n to adjust the delay. Each tap line corresponds to a different delay. When the XCLK and DLLCLK signals are synchronized, delay controller 110 stops adjusting the delay and locks the DLL to keep the XCLK and DLLCLK signals synchronized.

Figure 2:
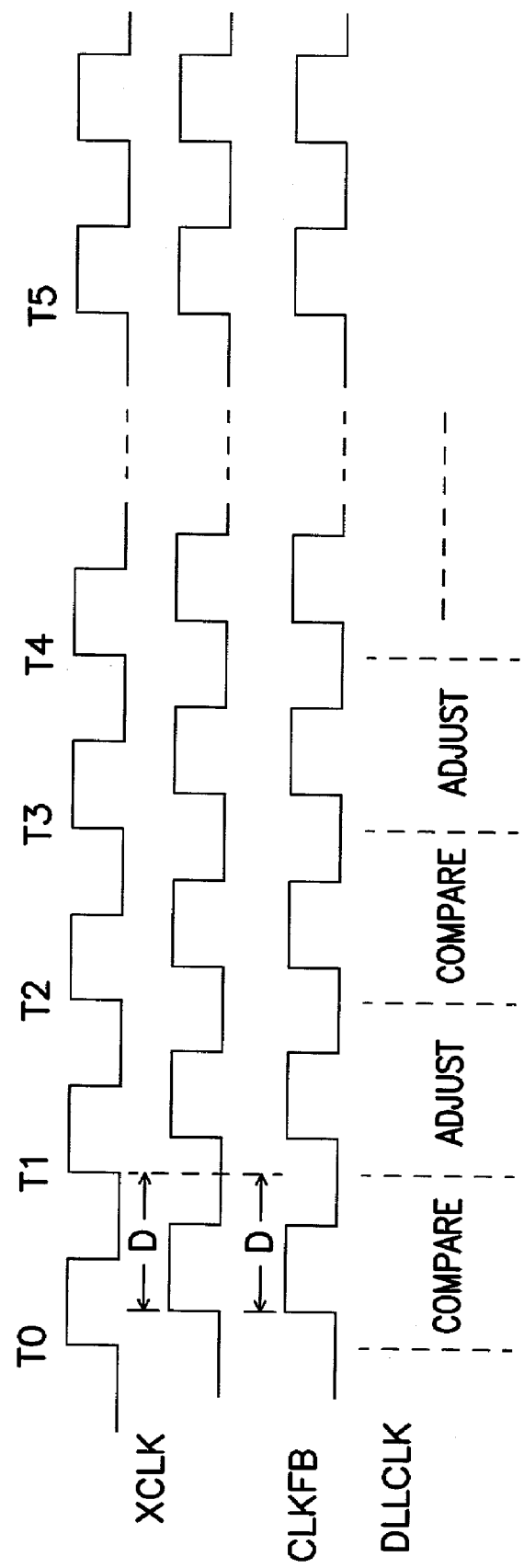
FIG. 2 shows an example of a timing diagram for FIG. 1.

FIG. 2 shows an example of a timing diagram for FIG. 1. At time T0, delay controller 110 compares (COMPARE) the edges of the XCLK and CLKFB signals and detects a delay D. The presence of delay D indicates that the XCLK and DLLCLK signals are not synchronized. At time T1, delay controller 110 selects an appropriate tap to adjust (ADJUST)

the delay applied by delay line 112 to change the timing of the DLLCLK and the CLKFB signals. Between times T2 and T4, delay controller 110 compares the XCLK and CLKFB signals again to adjust the delay to reduce delay D. The comparison and adjustment process repeats between times T4 and T5. At time T5, the XCLK and DLLCLK signals are synchronized. Delay controller 110 sets DLL 100 in a locked position.

Figure 3:
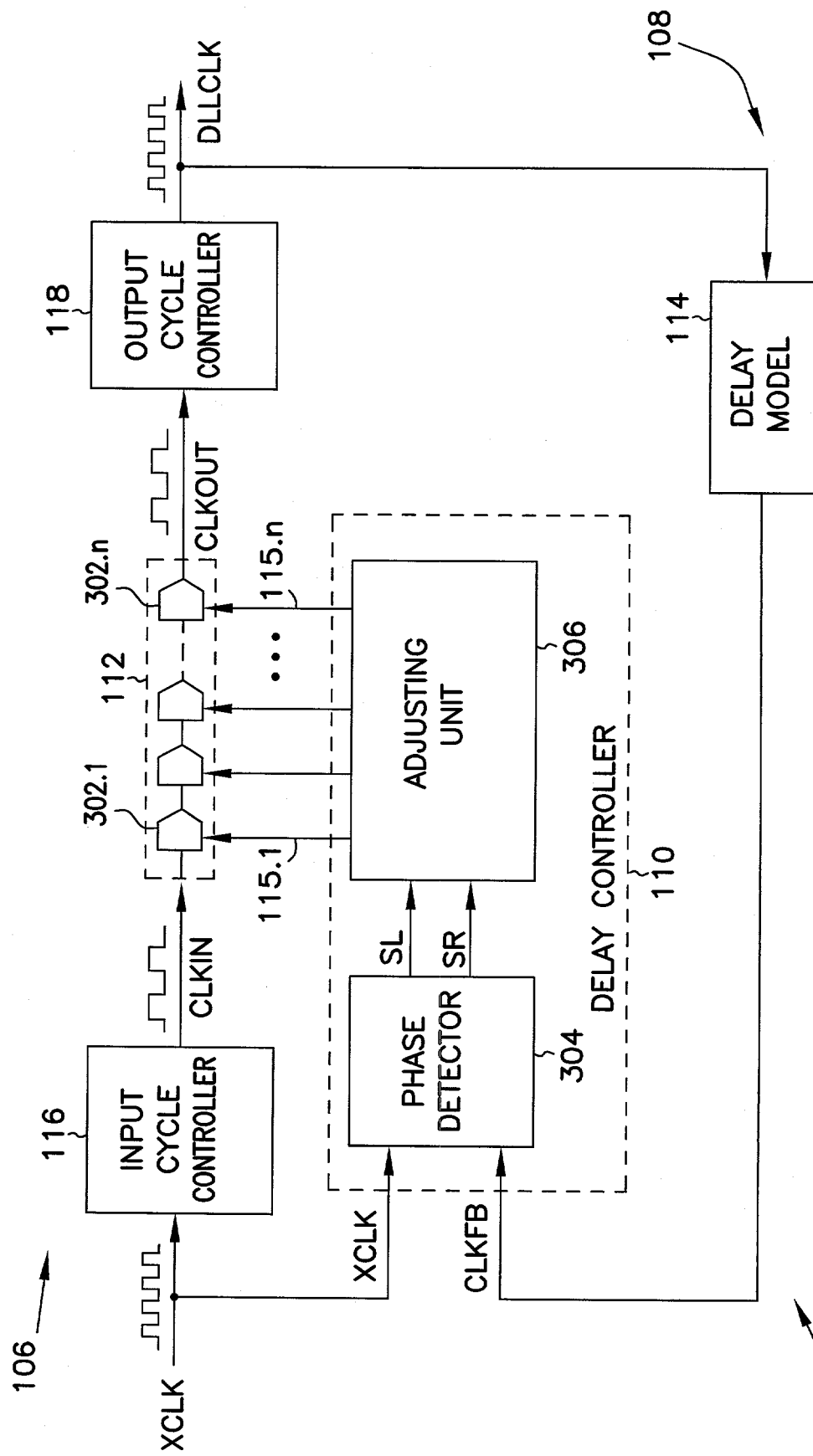
FIG. 3 shows more detail of the delay locked loop circuit of FIG. 1.

FIG. 3 shows more detail of the DLL of FIG. 1. Delay line 112 includes a plurality of delay elements 302.1-302.n, each connecting to a corresponding tap line among the tap lines 115.1-115.n. Each delay element delays a signal for a unit time delay. The delay applied by delay line 112 equals the product of the unit time delay and the number of activated delay elements. When a delay element is activated, it toggles at each edge of the CLKIN signal, allowing the CLKIN signal to propagate through. The CLKIN becomes the CLKOUT signal after propagating through a certain number of activated delay elements. The CLKIN and CLKOUT signals have an equal cycle time.

Delay controller 110 includes a phase detector 304 and an adjusting unit 306. Phase detector 304 compares the XCLK and CLKFB signals and activates shifting signals SR and SL when the XCLK and CLKFB signals are not synchronized. When activated, the SR or SL signal allows adjusting unit 306 to perform a shifting operation for selecting one of the tap lines 115.1-115.n to adjust a delay of delay line 112. In some embodiments, adjusting unit 306 increases the delay when the SR signal is activated and decreases the delay when the SL signal is activated. In other embodiments, adjusting unit 306 acts in the opposite direction, decreasing the delay when the SR signal is activated and increasing the delay when the SL signal is activated. Adjusting unit 306 adjusts the delay until the SR and SL signals are deactivated and the XCLK and CLKFB signals are synchronized.

Delay model 114 is modeled after a combination of input and output cycle controllers 116 and 118 so that when the XCLK and CLKFB signals are synchronized, the XCLK and DLLCLK signals are also synchronized. Delay model 114 has a time delay equal to the sum of a time delay of input cycle controller 116 and a time delay of output cycle controller 118. In some embodiments, delay model 114 has a construction that is identical to the combined constructions of input and output cycle controllers 116 and 118. Since a combination of input and output cycle controllers 116 and 118 and delay model 114 have equal time delay, the CLKFB is a version of the DLLCLK signal. Thus, when the XCLK and CLKFB signals are synchronized, the XCLK and DLLCLK signals are also synchronized.

Input and output cycle controllers 116 and 118 form cycle control circuitry for controlling a cycle time of the CLKIN and DLLCLK signals. Input cycle controller 116 modifies the cycle time of the XCLK signal to control the cycle time of the CLKIN signal. Output cycle controller 118 modifies the cycle time of the CLKOUT signal to control the cycle time of the DLLCLK signal.

Input cycle controller 116 increases the cycle time of the XCLK signal such that the cycle time of the CLKIN signal is greater than the cycle time of the XCLK signal. In some embodiments, input cycle controller 116 increases the cycle time of the XCLK signal such that the cycle time of the CLKIN signal is a multiple of the cycle time of the XCLK signal. Since the cycle time of the CLKIN signal is greater than the cycle time of the XCLK signal, the number of edges of the CLKIN signal is less than the number of edges of the XCLK signal. Hence, the CLKIN signal causes the activated delay elements to toggle fewer times than the XCLK signal would. Thus, propagating the CLKIN signal instead of the XCLK signal into delay line 112 generates fewer number of toggles, thereby reducing the power consumption.

In some embodiments, output cycle controller 118 decreases the cycle time of the CLKOUT signal such that the cycle time of the DLLCLK signal is smaller than the cycle time of the CLKOUT signal. Since the CLKIN and CLKOUT have an equal cycle time, the cycle time of the DLLCLK signal is also smaller than the cycle time of the CLKIN signal. In some embodiments, output cycle controller 118 decreases the cycle time of the CLKOUT signal such that the cycle time of the DLLCLK signal is equal to the cycle time of the XCLK signal.

Figure 4:
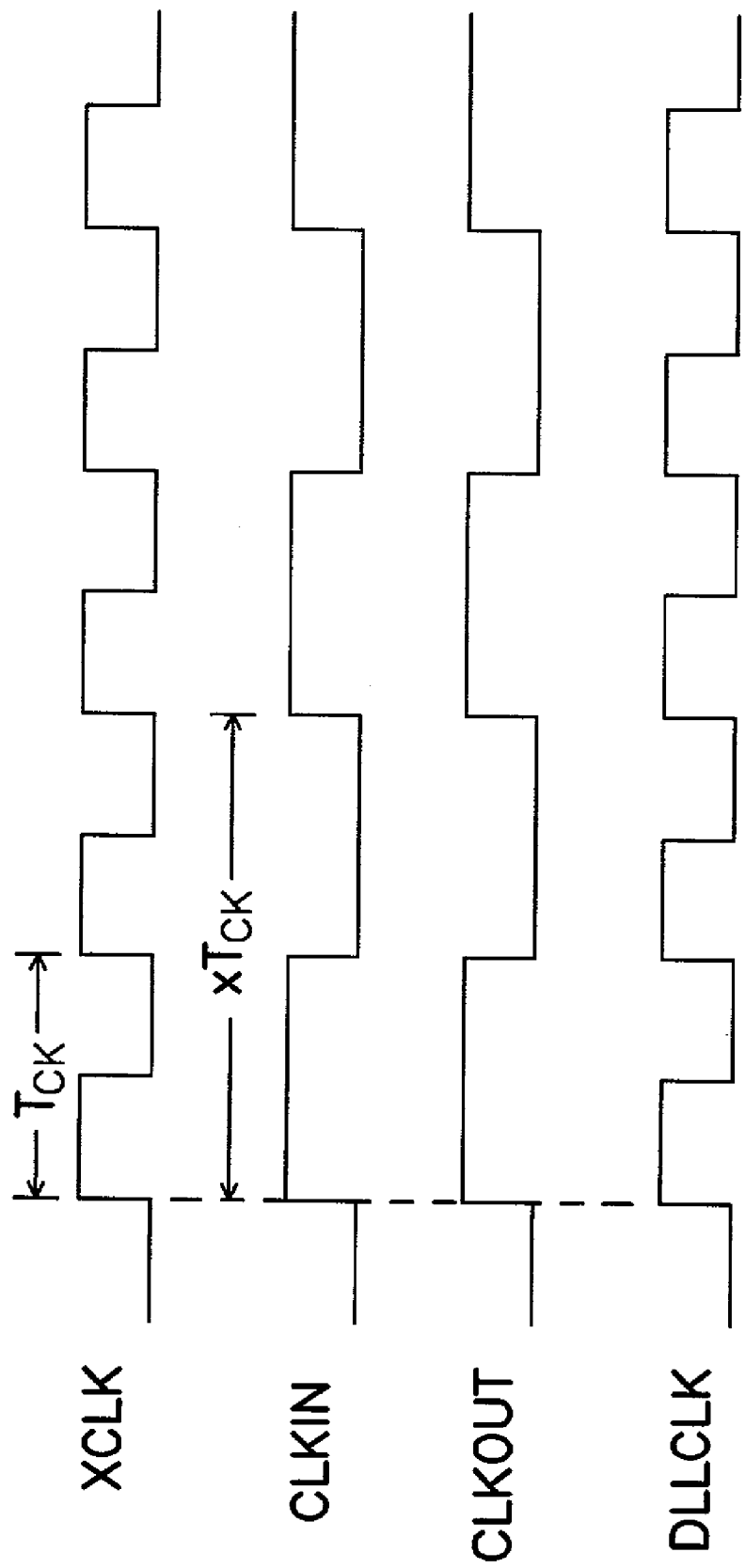
FIG. 4 is a timing diagram of various signals of the DLL of FIG. 3.

FIG. 4 is a timing diagram of various signals of the DLL of FIG. 3. For the purposes of comparison among the cycle times, the signals are lined up in FIG. 4. The XCLK and DLLCLK signals have an equal cycle time of $T_{CK}$. The CLKIN and CLKOUT signals have an equal cycle time of $xT_{CK}$, where x is greater than one. Therefore, $xT_{CK}$ is greater than $T_{CK}$. In some embodiments, x is an integer. Thus, $xT_{CK}$ is a multiple of $T_{CK}$. In FIG. 4, x is two. Hence, $xT_{CK}$ is twice $T_{CK}$.

Since $xT_{CK}$ is greater than $T_{CK}$, the number of edges of the CLKIN signal is less than the number of edges of the XCLK signal within every cycle of the CLKIN signal. Therefore, propagating the CLKIN signal instead of the XCLK signal into delay line 112 generates fewer number of toggles.

Figure 5:
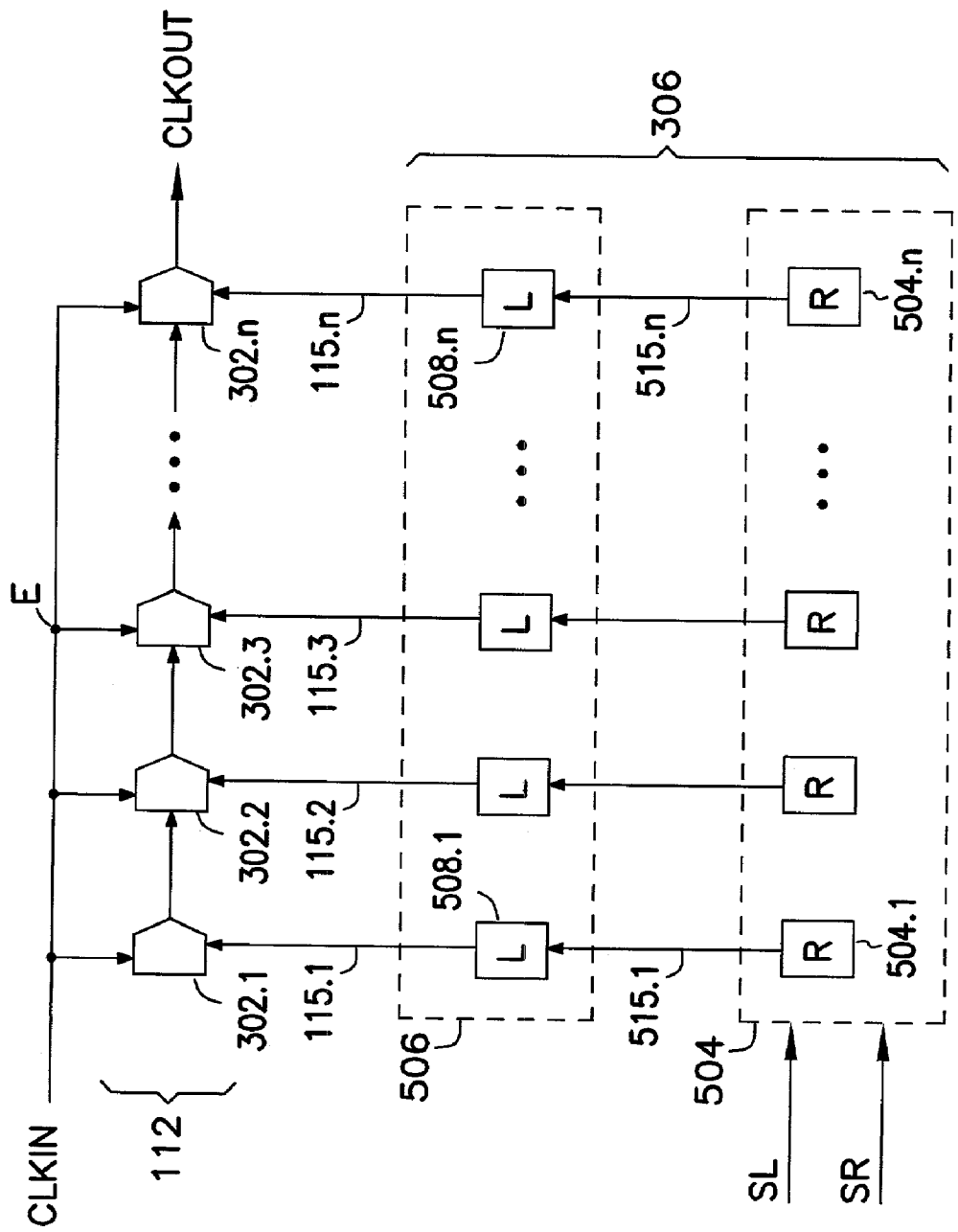
FIG. 5 shows a delay line and an adjusting unit of FIG. 3.

FIG. 5 shows delay line 112 and adjusting unit 306 of FIG. 3. Adjusting unit 306 includes a shift register 504 having a plurality of register cells (R) 504.1-504.n. Shift register 504 controls the contents of the register cells based on the SR and SL signals to activate the signals on tap lines 515.1-515.n. A select logic circuit 506 has a plurality of latches (L) 508.1-508.n, each connecting to a corresponding shift line. The signal on each shift line controls the content of a corresponding latch. Select logic circuit 506 selects tap lines 115.1-115.n based on the contents of latches 508.1-508.n to adjust the delay applied by delay line 112.

The CLKOUT signal exits delay line 112 at a fixed exit point from the output of delay element 302.n. The CLKIN signal is present at all of the delay elements, but only one of the delay elements allows it to enter at one entry point based on one of the selected tap lines 115.1-115.n. For example, when tap line 115.3 is selected, delay element 302.3 allows the CLKIN signal to enter delay line 112 at an entry point E. The CLKIN signal propagates from delay element 302.3 to delay element 302.n and becomes the CLKOUT signal. The entry point E moves along the inputs of delay elements 302.1-302.n when adjusting unit 306 adjusts the delay. The entry point E remains at the same position while the XCLK and DLLCLK (FIG. 3) are synchronized.

In the above example, delay elements 302.3 through 302.n are activated delay elements; they toggle at each edge of the CLKIN signal. The number of activated delay elements varies when the entry point E moves to a different position. The number of activated delay elements is fixed while the XCLK and DLLCLK are synchronized.

Figure 6:
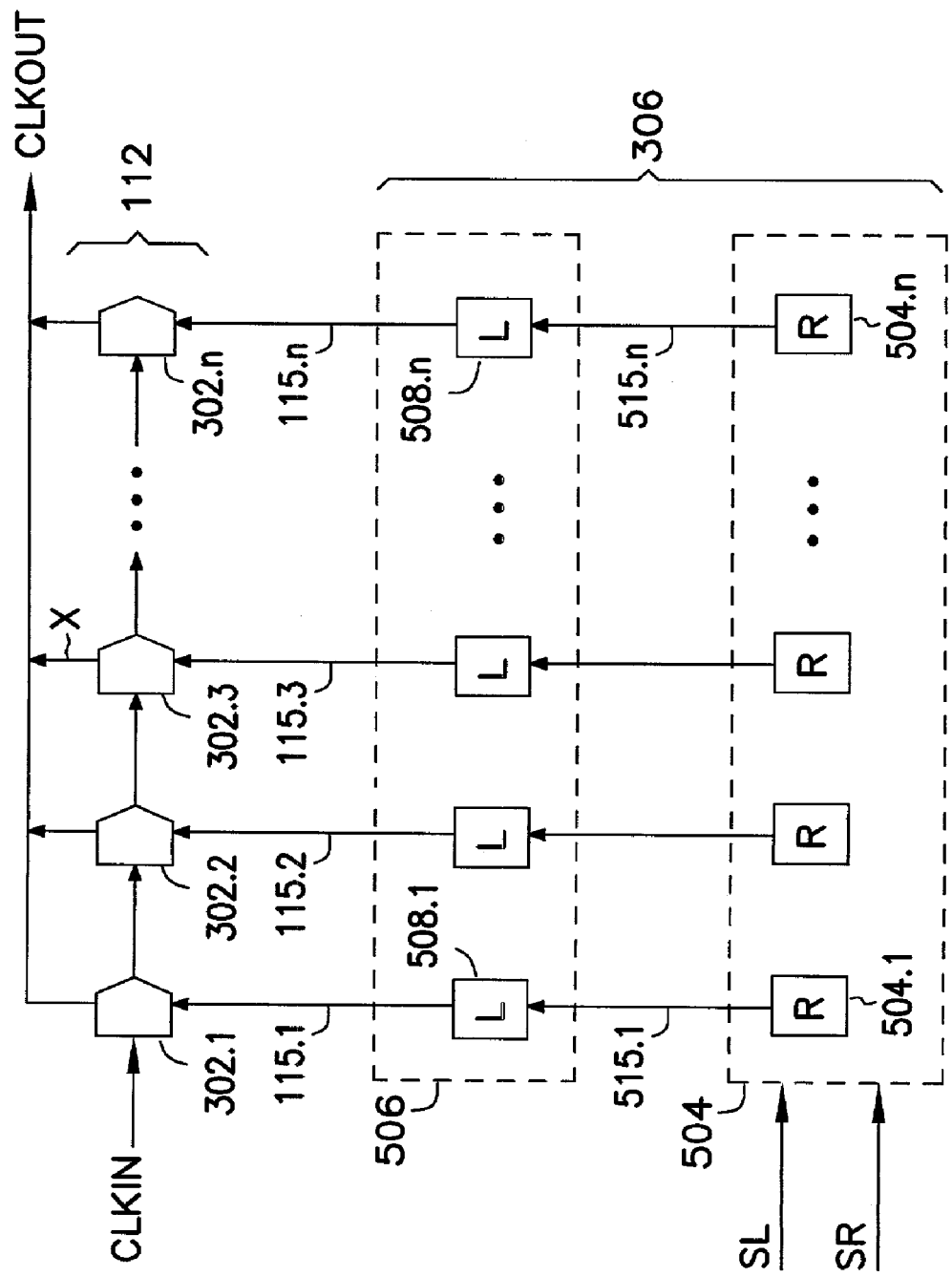
FIG. 6 shows a variation of the delay line and the adjusting unit of FIG. 5.

FIG. 6 shows a variation of the delay line and the adjusting unit of FIG. 5. Delay line 112 and adjusting unit 306 of FIG. 5 and FIG. 6 have similar elements. In FIG. 6, The CLKOUT signal exits delay line 112 at any one of the exit points from the outputs of delay elements 302.1.-302.n based on one of the selected tap lines 115.1-115.n. The CLKIN signal enters delay line 112 at a fixed point at delay element 302.1. For example, tap line 115.3 selects delay element 302.3 to allow the CLKOUT to exit delay line 112 at an exit point X. The CLKIN signal propagates from delay element 302.1 to delay element 302.3 and becomes the CLKOUT signal. The exit point X moves along the outputs of delay elements 302.1-302.n when adjusting unit 306 adjusts the delay. The exit point X remains at the same position while the XCLK and DLLCLK (FIG. 3) are synchronized.

In the example in FIG. 6, delay elements 302.1 through 302.3 are activated delay elements and toggle at each edge of the CLKIN signal. The number of activated delay elements varies when the exit point X moves to a different position. The number of activated delay elements is fixed while the XCLK and DLLCLK are synchronized.

Figure 7:
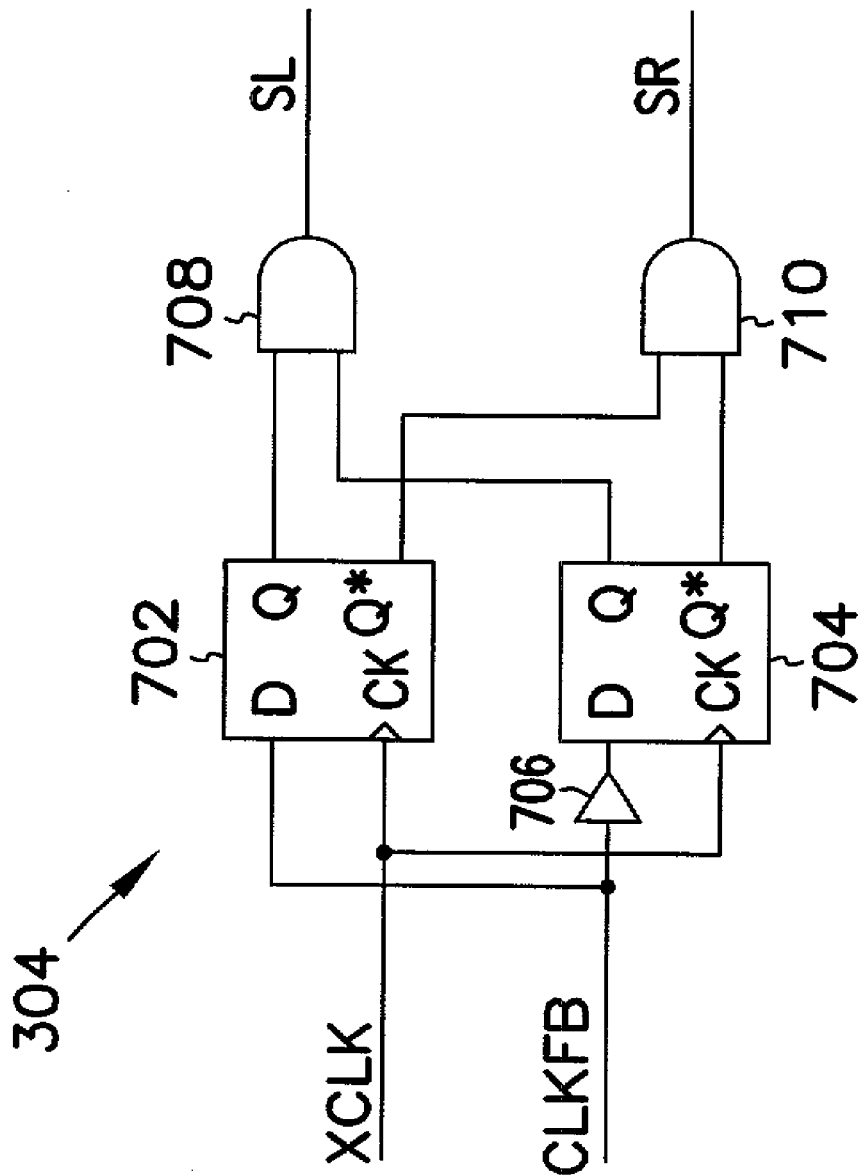
FIG. 7 shows a phase detector according to an embodiment of the invention.

FIG. 7 shows a phase detector according to an embodiment of the invention. Phase detector 304 includes flip flops 702 and 704, each having inputs D and CK and outputs Q and Q*. In some embodiments, flip flops 702 and 704 are D-Q flip flops. Input D of flip flop 702 receives the CLKFB signal and input D of flip flop 704 receives a delay version of the CLKFB signal through a delay 706. Both outputs Q connect to an AND gate 708. Both outputs Q* connect to an AND gate 710. Both inputs CK of the flip flops receive the XCLK signal. In some embodiments, delay 706 has a delay equal to the delay of each of delay elements 302.1-302.n (FIG. 3).

Flip flops 702 and 704, delay 706, and AND gates 708 and 710 form a comparator for comparing the XCLK and CLKFB signals to activate the SR and SL signals. The SR signal is activated when the rising edges of the XCLK and CLKFB signals are separated by more than 180 degrees and less than 360 degrees. The SL signal is activated when the rising edges of the XCLK and CLKFB signals are separated by more than zero degree and less than or equal to 180 degrees.

Figure 8:
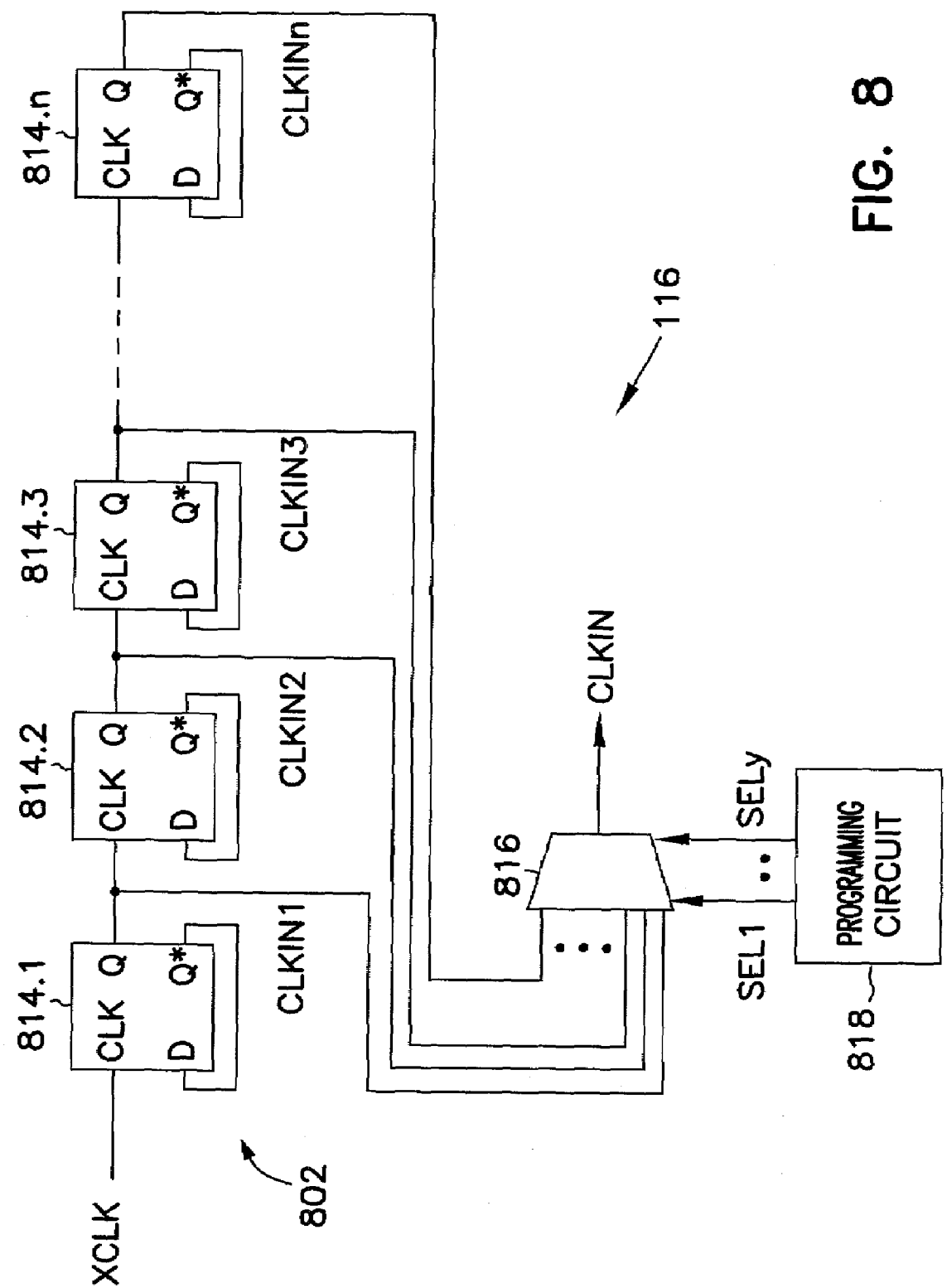
FIG. 8 shows an input cycle controller according to an embodiment of the invention.

FIG. 8 shows an input cycle controller according to an embodiment of the invention. Input cycle controller 116 includes an input frequency modifier 802 and a selector 816. Input frequency modifier 802 has a plurality of flip flops 814.1 through 814.n forming a frequency divider to divide the frequency of the XCLK signal.

Each of the flip flops 814.1-814.n has two input nodes CLK and D, and two output nodes Q and Q*. In some embodiments, each of the flip flops 814.1-814.n is a D-Q flip flop. Flip flops 814.1-814.n divide the XCLK signal into a plurality of selectable start signals CLKIN1-CLKINn, Each succeeding selectable start signal has a cycle time equal to twice the cycle time of the preceding selectable start signal. The CLKINn signal has a cycle time equaled to $2^n$ times the cycle time of the XCLK signal, where n is the total number of flip flops 814.1-814.n.

A selector 816 selects one of the CLKIN1-CLKINn signals as the CLKIN signal based on a combination of select signals SEL1-SELy. In some embodiments, selector 816 is a n:1 multiplexor. A programming circuit 818 sets the combination of the SEL1-SELy signals. Programming circuit 818 includes fuse devices, electrical fuse devices, laser fuse devices, storage elements, or other programmable elements. These elements are programmed to set a combination of the SEL1-SELy signals.

Figure 9:
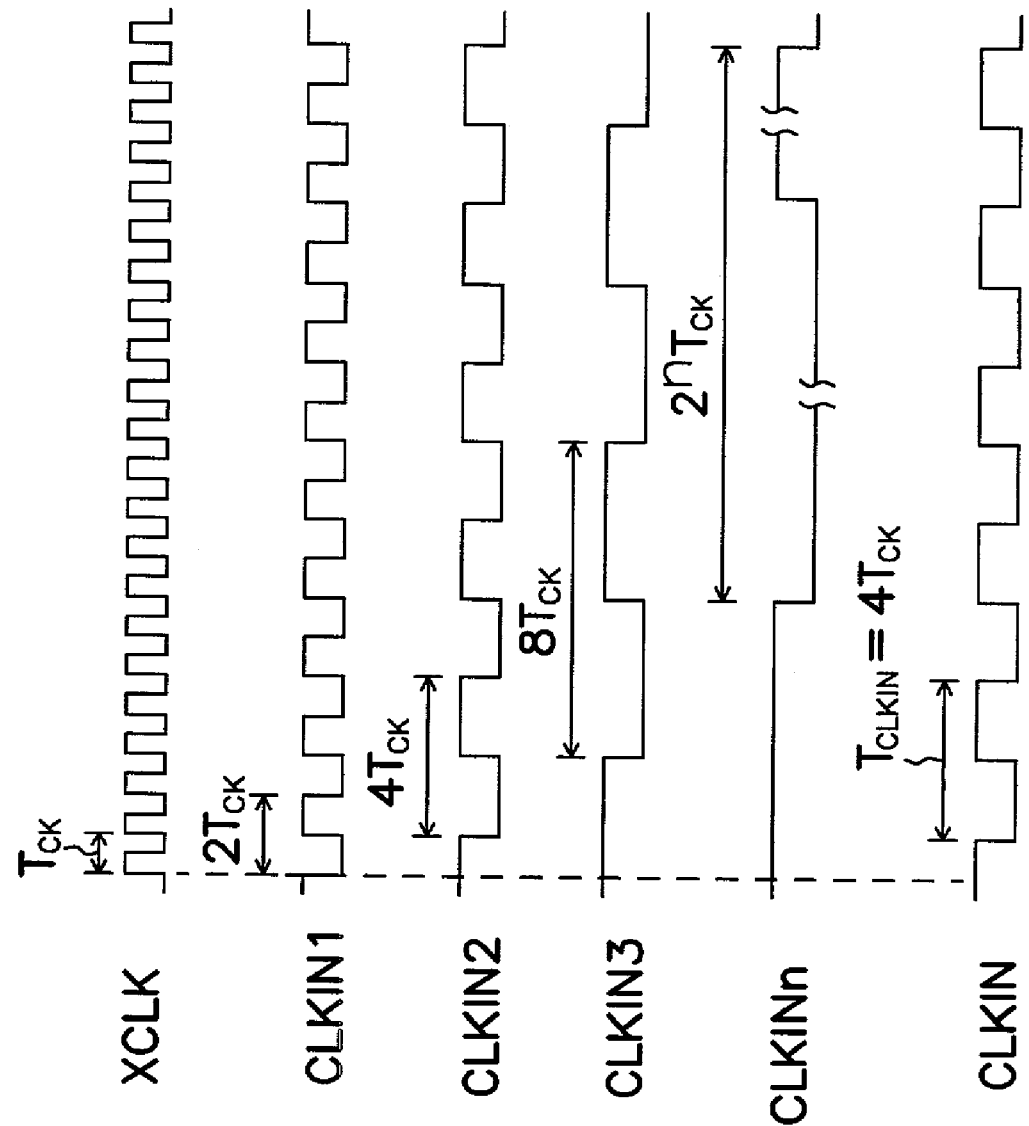
FIG. 9 is a timing diagram for FIG. 8.

FIG. 9 is a timing diagram for FIG. 8. For clarity, FIG. 9 shows only the CLKIN1, CLKIN2, CLKIN3, and CLKINn signals. The XCLK signal has a cycle time $T_{CK}$. The CLKIN1 signal has a cycle time equaled to $2^1$ times $T_{CK}$ (2 $T_{CK}$). The CLKIN2 signal has a cycle time equaled to $2^2$ times $T_{CK}$ (4 $T_{CK}$) The CLKIN3 signal has a cycle time equaled to $2^3$ times $T_{CK}$ (8 $T_{CK}$). The CLKINn has a cycle time of $2^n$ times $T_{CK}$. In embodiments represented by FIG. 9, the CLKIN signal is selected from the CLKIN2 signal as an example. In other embodiments, the CLKIN signal can be selected from any one of the CLKIN1-CLKINn signals.

Figure 10:
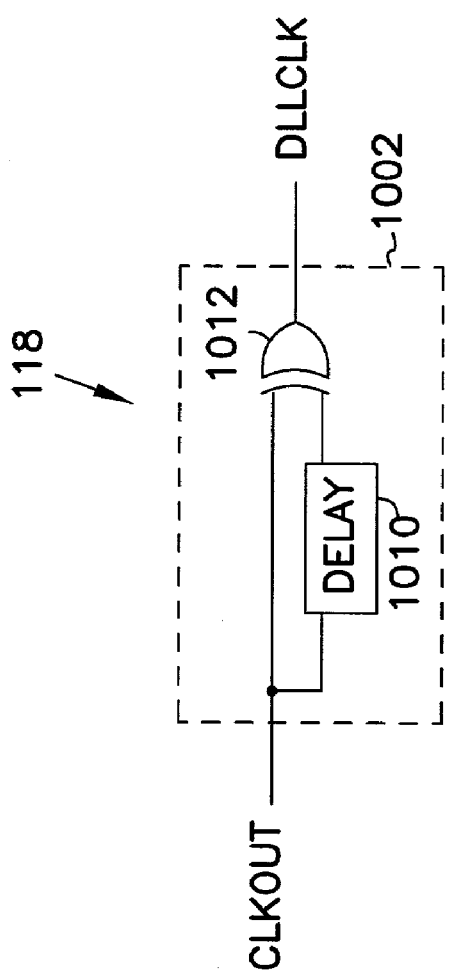
FIG. 10 shows an output cycle controller according to an embodiment of the invention.

FIG. 10 shows an output cycle controller according to an embodiment of the invention. Output cycle controller 118 includes an output frequency modifier 1002 for modifying the frequency of the CLKOUT signal. Output frequency modifier 1002 has a delay component 1010 and an exclusive OR gate 1012 forming a frequency multiplier to multiply the frequency of the CLKOUT signal to generate the DLLCLK signal. The delay of delay component 1010 can be selected such that the cycle time of the DLLCLK signal is smaller than the cycle time of the CLKOUT signal.

Figure 11:
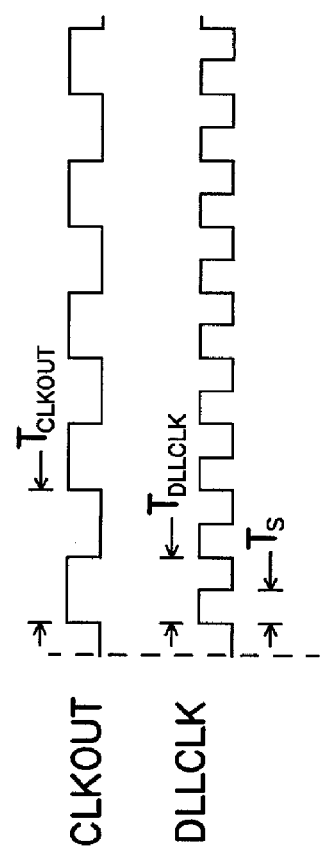
FIG. 11 is a timing diagram for FIG. 10.

FIG. 11 is a timing diagram for cycle controller 118 of FIG. 10. $T_{CLKOUT}$ is the cycle time of the CLKOUT signal. $T_{DLLCLK}$ is the cycle time of the DLLCLK signal; $T_{DLLCLK}$ is smaller than $T_{CLKOUT}$. $T_S$ indicates a time that the DLLCLK signal is at a certain signal level. In FIG. 11, $T_S$ indicates a time that the DLLCLK signal is high. In some embodiments, $T_S$ indicates a time that the DLLCLK signal is low.

$T_S$ can be adjusted by selecting the delay of delay component 1010 (FIG. 10). In some embodiments, the delay of delay component 1010 is selected such that $T_S$ is one-half of $T_{DLLCLK}$ so that the DLLCLK signal has a 50% duty cycle. In other embodiments, the delay of delay component 1010 can be selected such that $T_S$ equals a fraction of $T_{DLLCLK}$ other than one-half $T_{DLLCLK}$.

Figure 12:
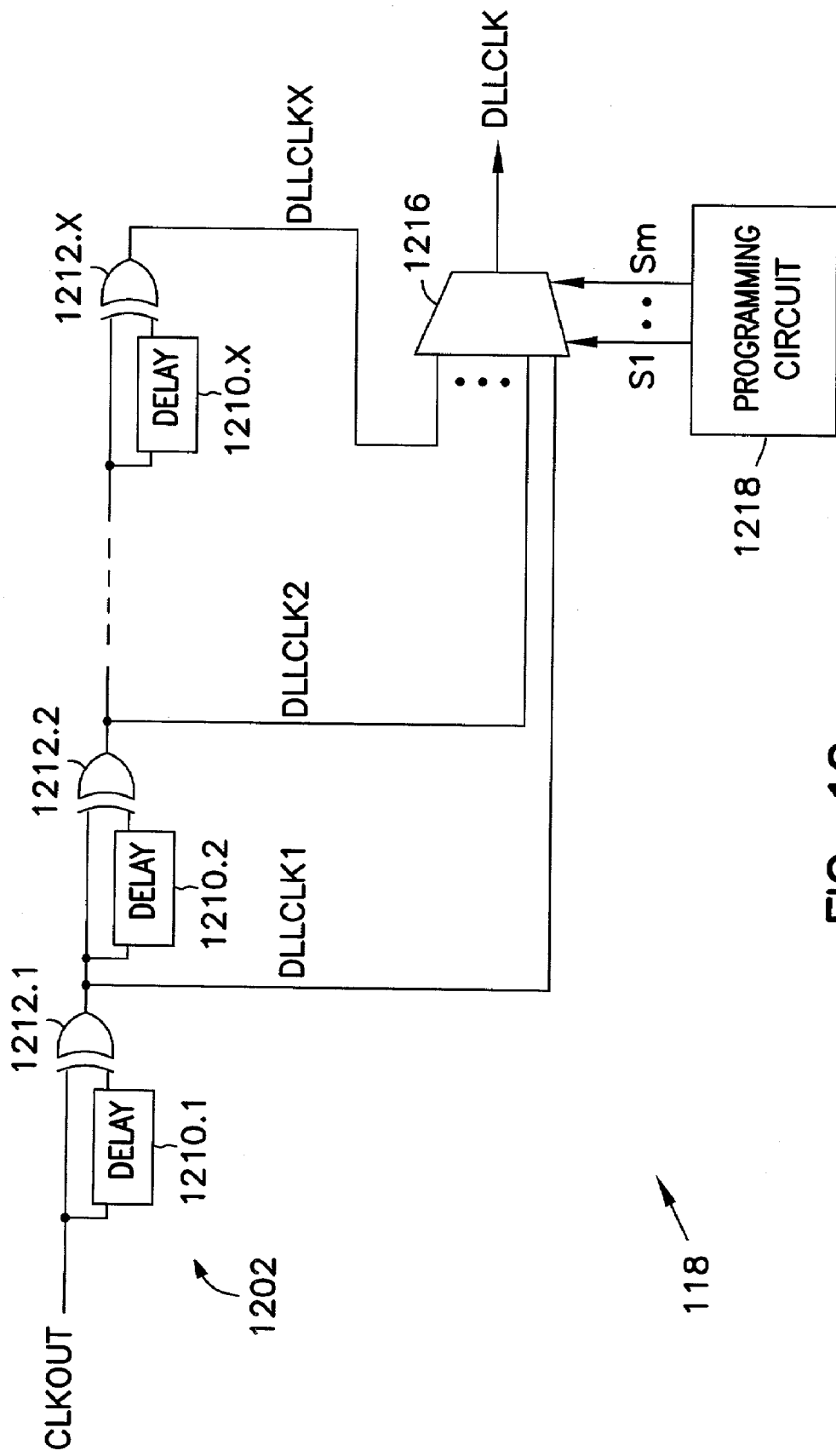
FIG. 12 shows an output cycle controller according to another embodiment of the invention.

FIG. 12 shows an output cycle controller according to another embodiment of the invention. Output cycle controller 118 includes an output frequency modifier 1202 for modifying the frequency of the CLKOUT signal. Output frequency modifier 1202 has a plurality of delay components 1210.1-1210.X and a plurality of exclusive OR gates 1212.1-1212.X. These delay components and gates form a frequency multiplier for multiplying the frequency of the CLKOUT signal to generate a plurality of selectable internal signals DLLCLK1-DLLCLKX; each succeeding selectable internal signal has a cycle time that is less than the cycle time of the preceding selectable internal signal. The DLLCLKX signal has a cycle time equaled to $(\frac{1}{2}^X)$ times the cycle time of the CLKOUT signal, where X is the total number of gates 1212.1-1212.X.

A selector 1216 selects one of the DLLCLK1-DLLCLKX signals as the DLLCLK signal based on a combination of select signals S1-Sm. In some embodiments, selector 1216 is a X:1 multiplexor. A programming circuit 1218 sets the combination of the S1-Sm signals. Programming circuit 1218 includes fuse devices, electrical fuse devices, laser fuse devices, storage elements, or other programmable elements. These elements are programmed to set a combination of the S1-Sm signals.

Figure 13:
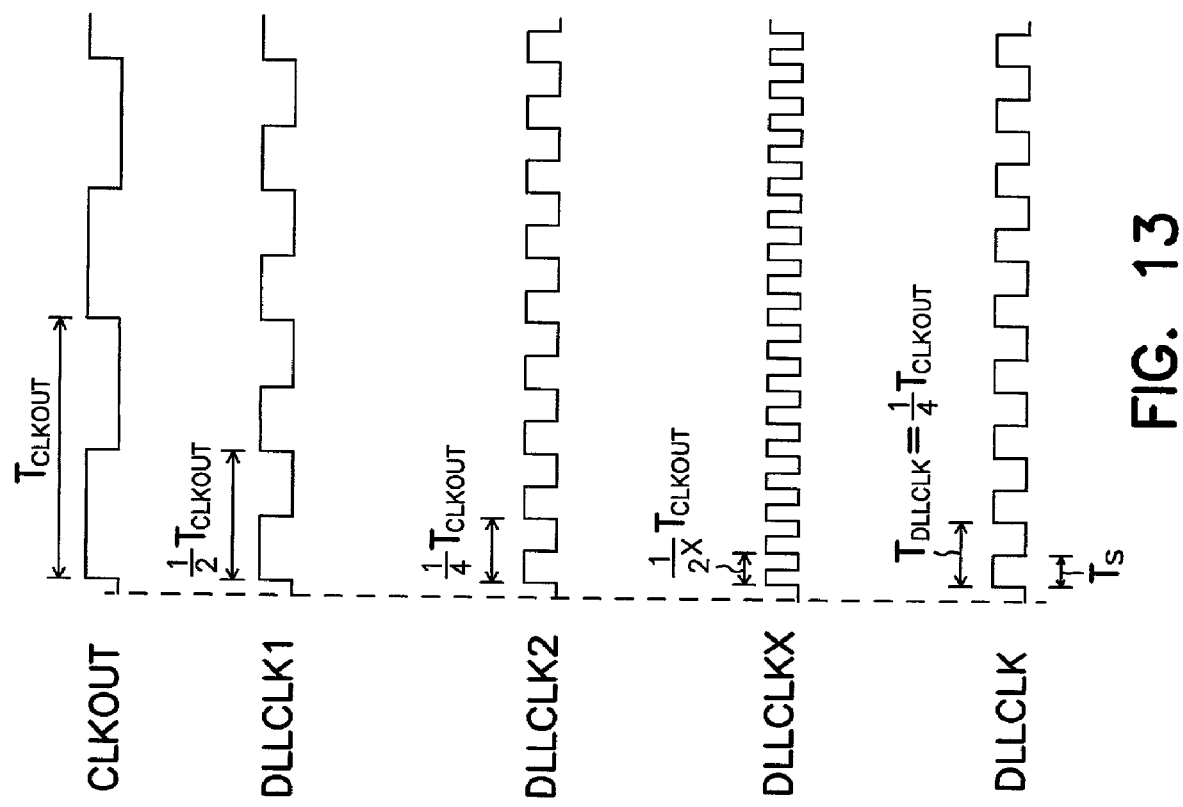
FIG. 13 is a timing diagram for FIG. 12.

FIG. 13 is a timing diagram for FIG. 12. For clarity, FIG. 13 shows only the DLLCK1, DLLCLK2, and DLLCLKX signals. The CLKOUT signal has a cycle time $T_{CLKOUT}$. The DLLCLK1 signal has a cycle time equaled to $\frac{1}{2} T_{CLKOUT}$. The DLLCLK2 signal has a cycle time equaled to $\frac{1}{4} T_{CLKOUT}$. The DLLCLKX signal has a cycle time equaled to $\frac{1}{2}^X T_{CLKOUT}$. In embodiments represented by FIG. 13, the DLLCLK signal is selected from the DLLCLK2 signal as an example. In this example, the cycle time of the DLLCLK signal, $T_{DLLCLK}$, equals $\frac{1}{4} T_{CLKOUT}$. In other embodiments, the DLLCLK signal can be selected from any one of the DLLCLK1-DLLCLKX signals.

$T_S$ indicates a time that the DLLCLK signal is at a certain signal level. $T_S$ can be adjusted by selecting the delays of delay components 1210.1-1210.X (FIG. 12). For example, the delays of delay components 1210.1-1210.X can be selected such that $T_S$ is one-half of $T_{DLLCLK}$ so that the DLLCLK signal has a 50% duty cycle. As another example, the delays of delay components 1210.1-1210.X can be selected such that $T_S$ equals a fraction of $T_{DLLCLK}$ other than one-half $T_{DLLCLK}$.

Figure 14:
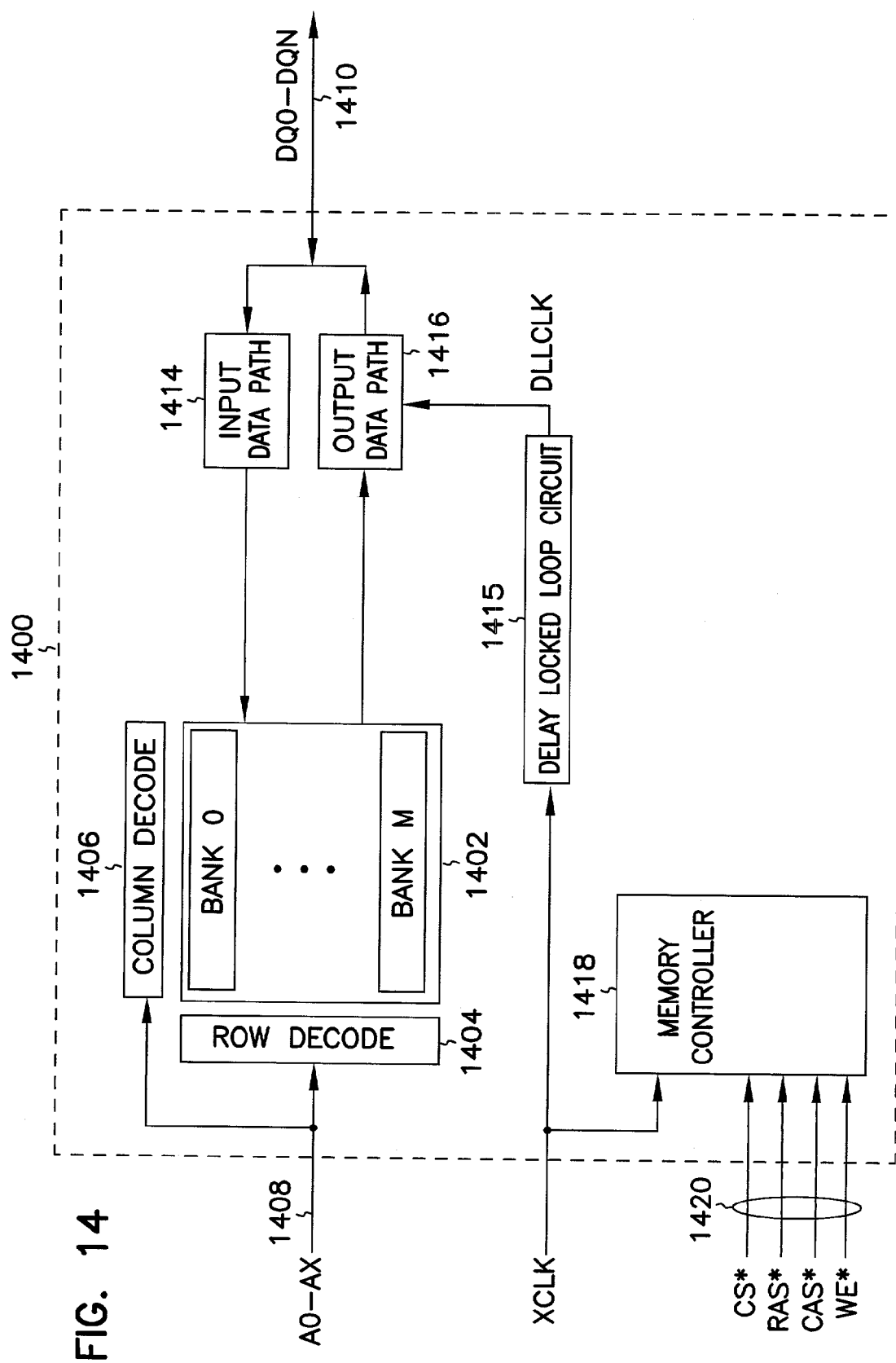
FIG. 14 shows a memory device according to an embodiment of the invention.

FIG. 14 shows a memory device according to an embodiment of the invention. Memory device 1400 includes a main memory 1402 having a plurality of memory cells arranged in rows and columns. The memory cells are grouped into a plurality of memory banks indicated by bank 0 through bank M. Row decode 1404 and column decode 1406 access the memory cells in response to address signals A0 through AX (A0-AX) on address lines (or address bus) 1408. A data input path 1414 and a data output path 1416 transfer data between banks 0-M and data lines (or data bus) 1410. Data lines 1410 carry data signals DQ0 through DQN. A memory controller 1418 controls the modes of operations of memory device 1400 based on control signals on control lines 1420. The control signals include, but are not limited to, a Chip Select signal CS*, a Row Access Strobe signal RAS*, a Column Access Strobe CAS* signal, a Write Enable signal WE*, and an external clock signal XCLK.

Memory device 1400 further includes a DLL 1415 having a delay line for receiving the XCLK signal to generate an internal signal DLLCLK. The DLLCLK signal serves as a clock signal to control a transfer of data on data output path 1416. DLL 1415 includes cycle control circuitry for controlling the cycle time of the signal entering the delay and the cycle time of the signal exiting the delay line. DLL 1415 includes embodiments of DLL 100 (FIG. 1 and FIG. 3).

In some embodiments, memory device 1400 is a dynamic random access memory (DRAM) device. In other embodiments, memory device 1400 is a static random access memory (SRAM), or flash memory. Examples of DRAM devices include synchronous DRAM commonly referred to as SDRAM (synchronous dynamic random access memory), SDRAM II, SGRAM (synchronous graphics random access memory), DDR SDRAM (double data rate SDRAM), DDR II SDRAM, and Synchlink or Rambus DRAMs. Those skilled in the art recognize that memory device 1400 includes other elements, which are not shown for clarity.

Figure 15:
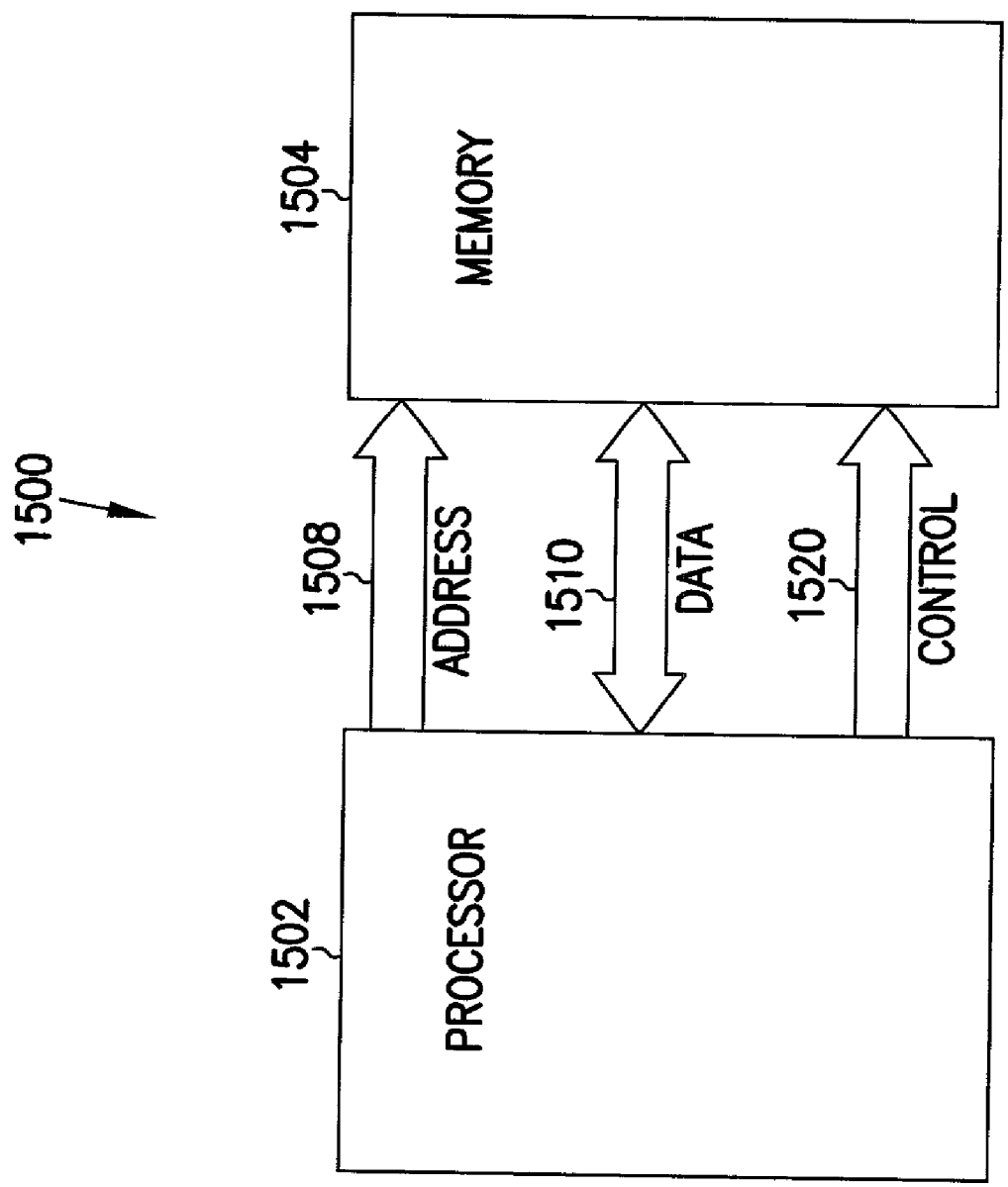
FIG. 15 shows a system according to an embodiment of the invention.

FIG. 15 shows a system 1500 according to an embodiment of the invention. System 1500 includes a first integrated circuit (IC) 1502 and a second IC 1504. IC 1502 and IC 1504 can include processors, controllers, memory devices, application specific integrated circuits, and other types of integrated circuits. In FIG. 15, IC 1502 represents a processor and IC 1504 represents a memory device. Processor 1502 and memory device 1504 communicate using address signals on lines 1508, data signals on lines 1510, and control signals on lines 1520.

Memory device 1504 includes embodiments of memory device 1400 (FIG. 14) including DLL 1415, which corresponds to DLL 100 (FIG. 1 and FIG. 3).

System 1500 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A circuit comprising:
    a forward path for receiving an external signal and to generate an internal signal, and including:
        a delay line for applying a delay to an input signal derived from the external signal to output an output signal;
        an input cycle controller connected to the delay line for controlling a time interval between corresponding edges of the input signal; and
        an output cycle controller including a frequency multiplier for controlling a time interval between corresponding edges of the internal signal based on the output signal, wherein the output cycle controller is configured to generate a plurality of selectable internal signals based on the output signal;
    a feedback path for providing a feedback signal based on a signal derived from the output signal; and
    a delay controller connected to the forward path and the feedback path for adjusting the delay.

2. The circuit of claim 1, wherein the input cycle controller includes an input frequency modifier for setting a number of edges of the input signal entering the delay line to be less than a number of edges of the external signal.

3. The circuit of claim 1, wherein delay controller includes:
    a phase detector for comparing the external and internal signals to activate shifting signals; and
    a shift register connected to the phase detector for adjusting the delay based on the shifting signals.

4. The circuit of claim 1, wherein the feedback path includes a delay model having a time delay equal to the sum of a time delay of the input cycle controller and a time delay of the output cycle controller.

5. A circuit comprising:
    a forward path for receiving an external signal and to generate an internal signal, and including:
        a delay line for applying a delay to an input signal derived from the external signal to output an output signal;
        an input cycle controller connected to the delay line for controlling a time interval between corresponding edges of the input signal, wherein the input cycle controller includes an input frequency modifier for setting a number of edges of the input signal entering the delay line to be less than a number of edges of the external signal; and
        an output cycle controller for controlling a time interval between corresponding edges of the internal signal based on the output signal, wherein the output cycle controller includes an output frequency modifier for setting a number of edges of the internal signal to be greater than a number of edges of the output signal, and wherein the output frequency modifier is configured to generate a plurality of selectable internal signals based on the output signal;
    a feedback path for providing a feedback signal based on a signal derived from the output signal; and
    a delay controller connected to the forward path and the feedback path for adjusting the delay.

6. The circuit of claim 1, wherein the input cycle controller includes an input frequency modifier for setting a time interval between the corresponding edges of the input signal to be a multiple of a time interval between corresponding edges of the external signal.

7. A circuit comprising:
a forward path for receiving an external signal and to generate an internal signal, and including:
a delay line for applying a delay to an input signal derived from the external signal to output an output signal;
an input cycle controller connected to the delay line for controlling a time interval between corresponding edges of the input signal, wherein the input cycle controller includes an input frequency modifier for setting a time interval between the corresponding edges of the input signal to be a multiple of a time interval between corresponding edges of the external signal; and
an output cycle controller for controlling a time interval between corresponding edges of the internal signal based on the output signal, wherein the output cycle controller includes an output frequency modifier for setting a time interval between the corresponding edges of the internal signal to be smaller than a time interval between corresponding edges of the output signal, and wherein the output frequency modifier is configured to generate a plurality of selectable internal signals based on the output signal;
a feedback path for providing a feedback signal based on a signal derived from the output signal; and
a delay controller connected to the forward path and the feedback path for adjusting the delay.

8. The circuit of claim 7, wherein the output cycle controller includes an output frequency modifier for setting a time interval between the corresponding edges of the internal signal to be equal to a time interval between the corresponding edges of the external signal.

9. A circuit comprising:
a delay line for applying a delay to an input signal derived from an external signal at a node to provide an output signal;
cycle control circuitry connected to the delay line for controlling a cycle time of the input signal entering the delay line and for modifying a cycle time of the output signal exiting the delay line to provide an internal signal, wherein a time interval between the corresponding edges of the internal signal is equal to a time interval between the corresponding edges of the external signal, and wherein the cycle control circuitry is configured to generate a plurality of selectable internal signals based on the output signal;
a phase detector connected to the node and to the cycle control circuitry for responding to the external signal at the node and to a delayed copy of the internal signal for activating shifting signals; and
an adjusting unit connected to the delay line for adjusting the delay based on the shifting signals.

10. The circuit of claim 9, wherein the circuit further includes a delay model for delaying a signal derived from the output signal to provide a feedback signal to the phase detector.

11. The circuit of claim 10, wherein the delay model has delay time equal to a delay time of the cycle control circuitry.

12. The circuit of claim 9, wherein the cycle control circuitry includes an input cycle controller for setting a cycle time of the input signal to be greater than a cycle time of the external signal.

13. The circuit of claim 9, wherein the cycle control circuitry includes an input cycle controller for setting a cycle time of the input signal to be a multiple of a cycle time of the external signal.

14. The circuit of claim 9, wherein the adjusting unit includes a shift register connected to the phase detector for adjusting the delay based on the shifting signals.

15. The circuit of claim 9, wherein the adjusting unit includes a shift register for receiving the shifting signals to adjust the delay.

16. A circuit comprising:
a delay line for applying a delay to an input signal derived from an external signal to provide an output signal;
cycle control circuitry connected to the delay line for controlling a cycle time of the input signal entering the delay line and for modifying a cycle time of the output signal exiting the delay line to provide an internal signal, wherein the cycle control circuitry includes an input cycle controller for setting a cycle time of the input signal to be greater than a cycle time of the external signal, wherein the cycle control circuitry further includes an output cycle controller for setting a cycle time of the internal signal to be smaller than a cycle time of the output signal, and wherein the output cycle controller is configured to generate a plurality of selectable internal signals based on the output signal;
a phase detector connected to the cycle control circuitry for activating shifting signals; and
an adjusting unit connected to the delay line for adjusting the delay based on the shifting signals.

17. A circuit comprising:
a delay line for applying a delay to an input signal derived from an external signal to provide an output signal;
cycle control circuitry connected to the delay line for controlling a cycle time of the input signal entering the delay line and for modifying a cycle time of the output signal exiting the delay line to provide an internal signal, wherein the cycle control circuitry includes an input cycle controller for setting a cycle time of the input signal to be a multiple of a cycle time of the external signal, wherein the cycle control circuitry further includes an output cycle controller for setting a cycle time of the internal signal to be smaller than a cycle time of the input signal, and wherein the ouput cycle controller is configured to generate a plurality of selectable signals based on the output signal
a phase detector connected to the cycle control circuitry for activating shifting signals; and
an adjusting unit connected to the delay line for adjusting the delay based on the shifting signals.

18. A circuit comprising:
a delay line for applying a delay to an input signal derived from an external signal to provide an output signal;
cycle control circuitry connected to the delay line for controlling a cycle time of the input signal entering the delay line and for modifying a cycle time of the output signal exiting the delay line to provide an internal signal, wherein the cycle control circuitry includes an input cycle controller for setting a cycle time of the input signal to be a multiple of a cycle time of the external signal, and wherein the cycle control circuitry further includes an output cycle controller for setting a cycle time of the internal signal to be equal to a cycle time of the external signals, and wherein the output cycle controller is configured to generate a plurality of selectable internal signals based on the output signal;

a phase detector connected to the cycle control circuitry for activating shifting signals; and an adjusting unit connected to the delay line for adjusting the delay based on the shifting signals.

19. A circuit comprising:

a plurality of delay elements for applying a delay to an input signal derived from an external signal to provide an output signal;

an input frequency modifier connected to the delay line for controlling a cycle time of the input signal;

an output frequency modifier connected to the delay line for modifying a cycle time of the output signal to provide an internal signal, wherein the cycle time of the output signal is greater than a cycle time of the internal signal, and wherein the output frequency modifier is configured to generate a plurality of selectable internal signals based on the output signal;

a phase detector connected to the input and output frequency modifiers to activate shifting signals; and an adjusting unit connected to the delay elements for adjusting the delay based on the shifting signals to keep the external and internal signals synchronized.

20. The circuit of claim 19, wherein the circuit further includes a delay model for delaying a signal derived from the output signal to provide a feedback signal to the phase detector.

21. The circuit of claim 20, wherein the delay model has a construction that is identical to constructions of the input and output cycle controllers combined.

22. The circuit of claim 19, wherein the input frequency modifier includes a frequency divider for dividing the frequency of the external signal to generate a plurality of selectable signals, each having a cycle time greater than a cycle time of the external signal.

23. The circuit of claim 19, wherein the phase detector includes a comparator to compare the external signal and a version of the internal signal.

24. The circuit of claim 19, wherein the adjusting unit includes a shift register for receiving the shifting signals to adjust the delay.

25. A circuit comprising:

a plurality of delay elements for applying a delay to an input signal derived from an external signal to provide an output signal;

an input frequency modifier connected to the delay line for controlling a cycle time of the input signal, wherein the input frequency modifier includes a frequency divider for dividing the frequency of the external signal to generate a plurality of selectable signals, each having a cycle time greater than a cycle time of the external signal, the selectable signals having different cycle times with respect to each other, and a selector connected to the frequency divider for selecting one of the selectable signals as the input signal;

an output frequency modifier connected to the delay line for modifying a cycle time of the output signal to provide an internal signal, wherein the output frequency modifier is configured to generate a plurality of selectable internal signals based on the output signal;

a phase detector connected to the input and output frequency modifiers to activate shifting signals; and an adjusting unit connected to the delay elements for adjusting the delay based on the shifting signals to keep the external and internal signals synchronized.

26. A circuit comprising:

a plurality of delay elements for applying a delay to an input signal derived from an external signal to provide an output signal;

an input frequency modifier connected to the delay line for controlling a cycle time of the input signal;

an output frequency modifier connected to the delay line for modifying a cycle time of the output signal to provide an internal signal, wherein the output frequency modifier includes a frequency multiplier for multiplying the frequency of the output signal to generate a plurality of selectable internal signals, each having a cycle time smaller than a cycle time of the output signal;

a phase detector connected to the input and output frequency modifiers to activate shifting signals; and an adjusting unit connected to the delay elements for adjusting the delay based on the shifting signals to keep the external and internal signals synchronized.

27. The circuit of claim 26 further includes a selector connected to the frequency multiplier for selecting one of the selectable internal signals as the internal signal.

28. An integrated circuit comprising:

a plurality of cells for storing data;

a path for transferring of data between the cells and data lines;

a circuit for generating an internal signal based on an external signal to control a transfer of the data on the path, the circuit including:

a delay line for applying a delay to an input signal derived from the external signal to output an output signal;

an input cycle controller connected to the delay line for controlling a time interval between corresponding edges of the input signal; and an output cycle controller and including a frequency multiplier for controlling a time interval between corresponding edges of the internal signal based on the output signal, wherein the output cycle controller is configured to generate a plurality of selectable internal signals based on the output signal;

a feedback path for providing a feedback signal based on a signal derived from the output signal; and a delay controller connected to the feedback path for adjusting the delay.

29. A system comprising:

a processor; and a memory device connected to the processor, the memory device including:

a plurality of memory cells;

a data path for transferring data between the memory cells and data lines; and a circuit for generating an internal signal based on an external signal at a node to control a transfer of the data on the data path, the circuit including:

a delay line for applying a delay to an input signal derived from the external signal to provide an output signal;

cycle control circuitry connected to the delay line for controlling a cycle time of the input signal entering the delay line and for modifying a cycle time of the output signal exiting the delay line to provide an internal signal, wherein a time interval between the corresponding edges of the internal signal is equal to a time interval between the corresponding edges of the external signal, and wherein the cycle control circuitry is configured to generate a plurality of selectable internal signals based on the output signal;

a phase detector connected to the node and to the cycle control circuitry for responding to both the external signal at the node and a delayed copy of the internal signal for activating shifting signals; and an adjusting unit connected to the delay line for adjusting the delay based on the shifting signals.

30. A method of processing signals, the method comprising:

applying a delay to an input signal derived from the external signal to output an output signal;

controlling a cycle time of the input signal;

modifying a cycle time of the output signal;

generating a plurality of selectable internal signals based on the output signal;

generating a feedback signal from an internal signal, wherein the internal signal is derived from one of the plurality selectable signals, and wherein the internal signal has a frequency greater than a frequency of the output signal; and adjusting the delay based on a time delay between the external signal and the feedback signal.

31. The method of claim 30, wherein controlling the cycle time of the input signal includes setting a number of edges of the input signal to be less than a number of edges of the external signal.

32. The method of claim 30, wherein controlling the cycle time of the input signal includes setting a time interval between edges of the input signal to be a multiple of a time interval between edges of the external signal.

33. A method of processing signals, the method comprising:

applying a delay to an input signal derived from the external signal to output an output signal;

controlling a cycle time of the input signal, wherein controlling the cycle time of the input signal includes setting a number of edges of the input signal to be less than a number of edges of the external signal;

modifying a cycle time of the output signal, wherein modifying the cycle time of the output includes setting a number of edges of the internal signal to be greater than a number of edges of the output signal;

generating a plurality of selectable internal signals based on the output signal;

generating a feedback signal from a signal derived from one of the plurality of selectable signals; and adjusting the delay based on a time delay between the external and feedback signals.

34. A method of processing signals, the method comprising:

applying a delay to an input signal derived from the external signal to output an output signal;

controlling a cycle time of the input signal, wherein controlling the cycle time of the input signal includes setting a time interval between edges of the input signal to be a multiple of a time interval between edges of the external signal;

modifying a cycle time of the output signal, wherein modifying the cycle time of the output includes setting a time interval between edges of the internal signal to be smaller than a time interval between edges of the output signal;

generating a plurality of selectable internal signals based on the output signal;

generating a feedback signal from a signal derived from one of the plurality of selectable signals; and adjusting the delay based on a time delay between the external and feedback signals.

35. The method of claim 34, wherein controlling a cycle time of the output includes setting a time interval between edges of the internal signal to be equal to a time interval between edges of the external signal.

36. A method of processing signals, the method comprising:

modifying a cycle time of an external signal to produce an input signal;

applying a delay to the input signal to produce an output signal;

generating a plurality of selectable internal signals based on the output signal:

producing an internal signal based on one of the plurality of selectable signals;

reducing a cycle time of the output signal; and adjusting the delay based directly on the external signal and a delayed copy of the internal signal to synchronize the external and internal signals.

37. The method of claim 36, wherein modifying the cycle time includes increasing the cycle time of the external signal.

38. The method of claim 36, wherein producing the internal signal includes modifying a cycle time of the output signal.

39. A method of processing signals, the method comprising:

modifying a cycle time of an external signal to produce an input signal;

applying a delay to the input signal to produce an output signal;

generating a plurality of selectable internal signals based on the output signal;

producing an internal signal based on one of the plurality of selectable signals, wherein producing the internal signal includes modifying a cycle time of the output signal and reducing a cycle time of the output signal; and adjusting the delay to synchronize the external and internal signals.

* * * * *

UNITED STATES PATENT AND TRADEMARK OFFICE
CERTIFICATE OF CORRECTION

PATENT NO. : 7,319,728 B2  Page 1 of 1
APPLICATION NO. : 10/147146
DATED : January 15, 2008
INVENTOR(S) : Bell et al.

It is certified that error appears in the above-identified patent and that said Letters Patent is hereby corrected as shown below:

On the Face Page, in field (56), under "Other Publications", in column 2, line 2, delete "REduction" and insert -- Reduction --, therefor.

Column 10, line 42, in Claim 17, after "signal," insert -- and --.

Column 10, line 44, in Claim 17, delete "ouput" and insert -- output --, therefor.

Column 10, line 47, in Claim 17, after "selectable" insert -- internal --.

Column 10, line 47, in Claim 17, after "output signal" insert -- ; --.

Column 10, line 65, in Claim 18, delete "signals," and insert -- signal, --, therefor.

Column 12, line 36, in Claim 28, after "controller" delete "and".

Column 13, line 20, in Claim 30, after "plurality" insert -- of --.

Column 14, line 27, in Claim 36, delete "signal:" and insert -- signal; --, therefor.

Signed and Sealed this

Twenty-fourth Day of June, 2008

JON W. DUDAS
*Director of the United States Patent and Trademark Office*